(12) United States Patent
Hui (10) Patent No.: US 9,274,388 B2
(45) Date of Patent: Mar. 1, 2016

(54) ARRAY SUBSTRATE HAVING COMMON ELECTRODE DRIVING INTERFACE PATTERN WITH SLITS, AND MANUFACTURING METHOD THEREOF, AND LIQUID CRYSTAL DISPLAY

(75) Inventor: Guanbao Hui, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 57 days.

(21) Appl. No.: 13/288,548

(22) Filed: Nov. 3, 2011

(65) Prior Publication Data

US 2012/0113377 A1   May 10, 2012

(30) Foreign Application Priority Data

Nov. 4, 2010   (CN) .......................... 2010 1 0536403

(51) Int. Cl.
*G02F 1/1345*   (2006.01)
*H01L 27/12*   (2006.01)
*G02F 1/1343*   (2006.01)

(52) U.S. Cl.
CPC .......... *G02F 1/1345* (2013.01); *G02F 1/13458* (2013.01); *G02F 2001/134372* (2013.01); *H01L 27/124* (2013.01)

(58) Field of Classification Search
CPC ................................................. G02F 1/13452
USPC ............... 349/149–152, 80; 345/80, 204–206
See application file for complete search history.

(56) References Cited

U.S. PATENT DOCUMENTS

| | | | | |
|---|---|---|---|---|
| 7,528,918 B2 * | 5/2009 | Yoo et al. | ....................... | 349/141 |
| 7,751,013 B2 * | 7/2010 | Oke et al. | ....................... | 349/141 |
| 2005/0270467 A1 * | 12/2005 | Lee | ............................... | 349/152 |
| 2006/0139553 A1 * | 6/2006 | Kang et al. | ................... | 349/149 |
| 2008/0024415 A1 | 1/2008 | Jung et al. | | |
| 2011/0250713 A1 * | 10/2011 | Kawasaki | ....................... | 438/34 |

FOREIGN PATENT DOCUMENTS

| | | |
|---|---|---|
| CN | 101114657 A | 1/2008 |
| JP | 2005-283862 A | 10/2005 |

OTHER PUBLICATIONS

First Chinese Office Action dated Jul. 31, 2013; Appln 201110102937.6.

* cited by examiner

*Primary Examiner* — Eric Wong
(74) *Attorney, Agent, or Firm* — Ladas & Parry LLP (57) ABSTRACT

The embodiments of the disclosed technology provide an array substrate and manufacturing method thereof, and liquid crystal display. The array substrate comprises a base substrate comprising a pixel region and a driving circuit region. The driving circuit region formed on the base substrate comprises a common electrode driving interface pattern, and a gate driving interface pattern and a data line driving interface pattern, which are connected with the common electrode driving interface pattern, and the common electrode driving interface pattern comprises slits therein and the portions of the common electrode driving interface pattern divided by the slits are connected with one another.

7 Claims, 7 Drawing Sheets

ARRAY SUBSTRATE HAVING COMMON ELECTRODE DRIVING INTERFACE PATTERN WITH SLITS, AND MANUFACTURING METHOD THEREOF, AND LIQUID CRYSTAL DISPLAY

BACKGROUND

Embodiments of the disclosed technology relate to an array substrate, a liquid crystal display and a method of manufacturing the array substrate.

Currently, liquid crystal displays are commonly used flat panel displays; thin film transistor liquid crystal displays (TFT-LCDs) have become the main type of liquid crystal displays due to advantages of low volume, low power consumption, no irradiation and so on. Generally, a TFT-LCD comprises a liquid crystal panel, a driving circuit and a backlight. The liquid crystal panel is the main component of the TFT-LCD and comprises an array substrate, a color filter substrate and a liquid crystal layer filled between the array substrate and the color filter substrate. The liquid crystal molecules of the liquid crystal layer rotate in order under the control of the voltages provided by the driving circuit so as to produce switch of light between brightness and darkness, and the control of the voltage is accomplished by thin film transistors.

Figure 1A:
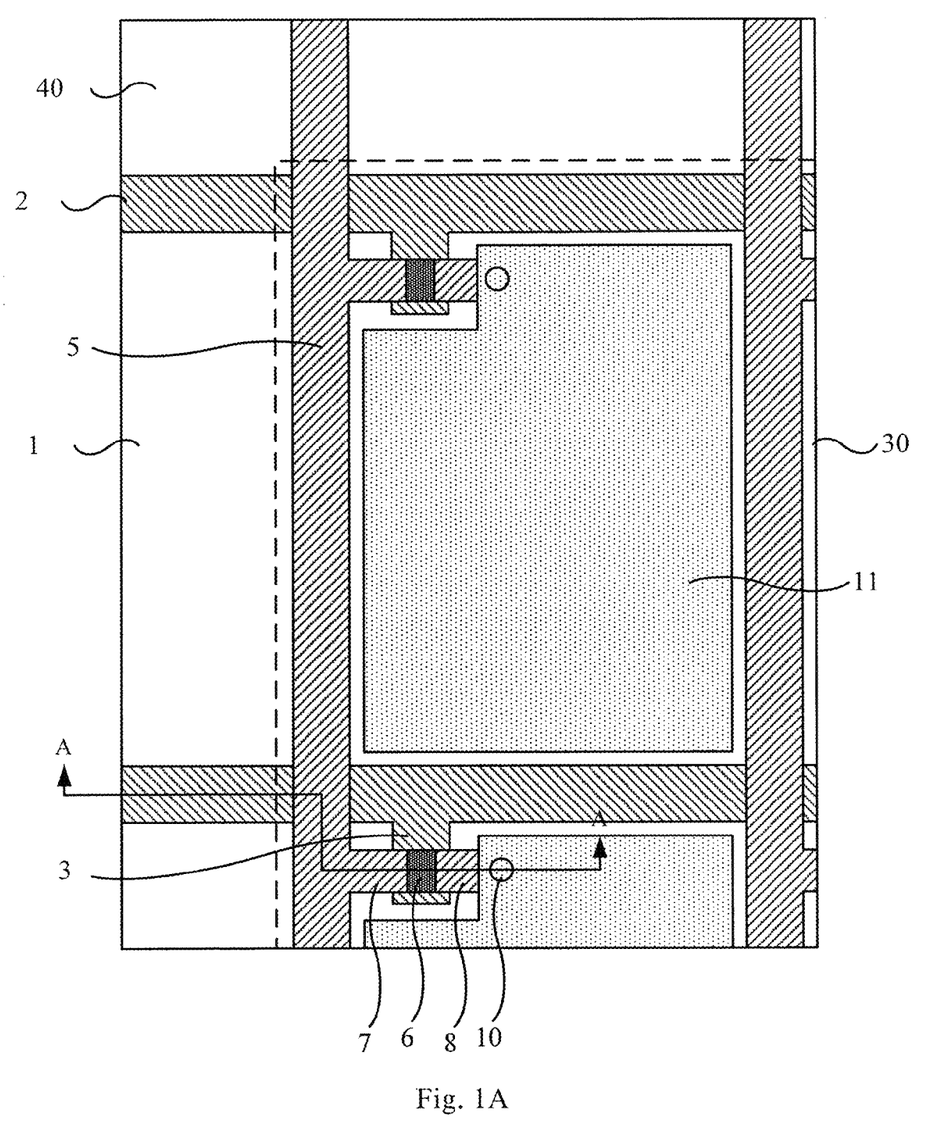
FIG. 1A is a partial top structural view of a conventional array substrate.
Figure 1B:
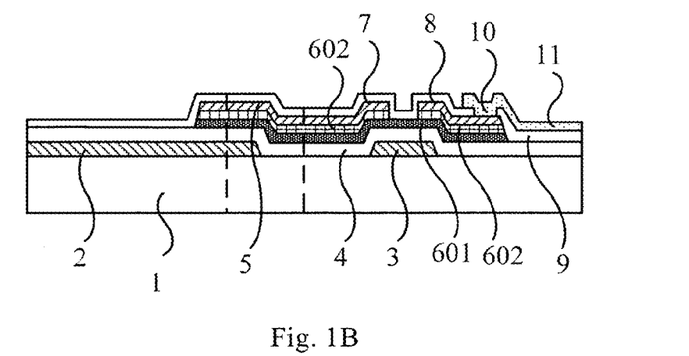
FIG. 1B is a side sectional structural view along the line A-A in FIG. 1A.

FIG. 1A is a partial structure top view of a conventional array substrate, and FIG. 1B is a sectional structural side view along a line A-A in FIG. 1A. As shown in FIGS. 1A and 1B, the array substrate comprises: a base substrate 1; data lines 5 and gate lines 2, formed to transversely and longitudinally cross each other on the base substrate 1; pixel units, arranged in a matrix form and defined by the data lines 5 and the gate lines 2. Each pixel unit comprises a thin film transistor (TFT) switch and a pixel electrode 11. Each TFT switch comprises a gate electrode 3, a source electrode 7, a drain electrode 8, and an active layer 6, which comprises a semiconductor layer 601 and an ohmic contact layer 602. The gate electrode 3 is connected with a gate line 2; the source electrode 7 is connected with a data line 5; the drain electrode 8 is connected with the pixel electrode 11, and the active layer 6 is formed between the source and drain electrodes 7 and 8 and the gate electrode 3. The gate line 2 and the gate electrode 3 are both covered by a gate insulation layer 4 so as to make the gate line 2 and the gate electrode 3 insulated from the TFT switch and the data line 5. The TFT switch and the data line 5 are both covered by a passivation layer 9 insulating the TFT switch and the data line 5 from the pixel electrode 11. The pixel electrode 11 can be connected with the drain electrode 8 through a passivation layer via 10. The above structure and patterns constitute a pixel region 30 on the array substrate (the portion surrounded by the dotted line in FIG. 1A), and an interface region 40 is outside of the pixel region. The detailed pattern in the interface region 40 is not shown in FIG. 1A.

As the development of TFT-LCD technologies, the requirement on viewing angle property of TFT-LCDs is continuously improved, so the technologies for wide viewing angle are proposed. Among the technologies for wide viewing angle, a technology of fringe field switch (FFS) adopts a transparent pixel electrode and a transparent common electrode both formed on a base substrate to produce a fringe field between the transparent common electrode and the transparent pixel electrode to drive the liquid crystal molecules above the transparent common electrode and the transparent pixel electrode. This FFS technology can widen viewing angles and improve the transmitting efficiency of the liquid crystal layer, thus has become a wide viewing angle technology which is widely researched and used.

The array substrate of an FFS type TFT-LCD can generally be manufactured by a five-mask process: in a first mask process, a first transparent common electrode layer (e.g., an indium tin oxide (ITO) layer) is formed on the base substrate, and then patterned to form a transparent common electrode comprising a common electrode line and a transparent electrode; gate lines and gate electrodes are formed in a second mask process, that is, the gate lines and the gate electrodes are formed on the transparent common electrode; patterns (SDT patterns) comprising data lines and active layers (generally comprising a semiconductor layer and an active silicon island), source and drain electrodes of TFTs are formed in a third gray tone or half tone mask, wherein the source and drain electrodes are formed above the active layer in each TFT, and the data lines are formed perpendicular to the gate lines; a passivation layer and passivation layer via holes are formed in a fourth mask, wherein the passivation layer is formed on the source and drain electrodes and cover the entire base substrate, and the passivation layer via holes are formed at the positions corresponding to the drain electrodes; in the fifth mask, a transparent pixel electrode layer (e.g., an ITO layer) is formed and then patterned to form the transparent pixel electrodes connected with the drain electrodes through the passivation layer via holes.

It is important to reduce the number of the mask process during the manufacturing of a TFT-LCD for lowering the manufacturing cost of TFT-LCDs. Thus, in order to reduce the manufacturing cost of TFT-LCDs a four-mask process is currently adopted to manufacture FFS type TFT-LCDs. The four-mask process differs from the five-mask process in that: the transparent common electrode, gate lines and gate electrodes are simultaneously formed in the first mask process by using a gray tone or half tone mask; at the same time, peripheral driving circuits, such as an interface region of the gate lines, an interface region of the common electrodes and so on, are also formed in the first mask process.

Figure 2A:
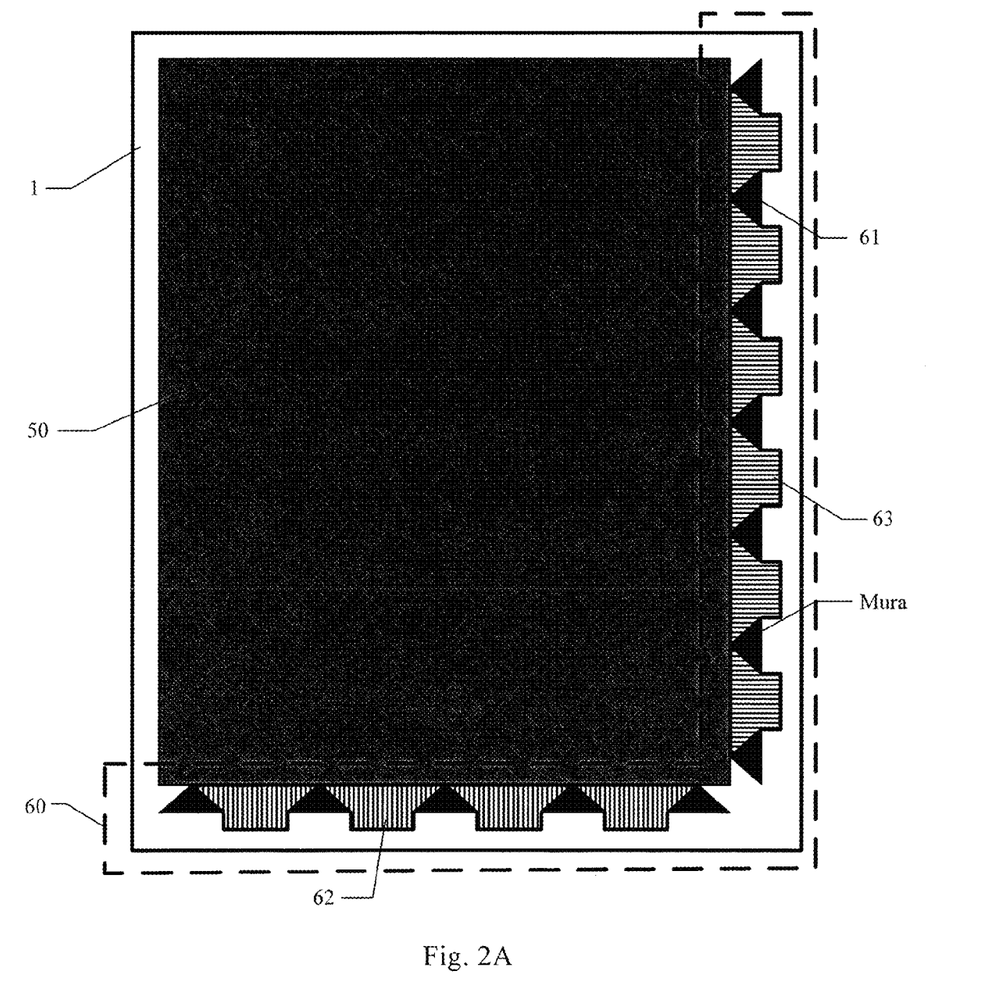
FIG. 2A is a top structural view of a conventional array substrate.

However, in the conventional technology, in forming the transparent common electrode, the gate lines and the gate electrodes through a gray tone or half tone mask, since the concentration of developing solution in the pixel region adjacent to the driving circuit pattern in the peripheral driving circuit region become not uniform with respect to the driving circuit pattern, which causes the thickness of the photoresist in the pixel region adjacent to the diving circuit pattern layer after exposure and development is obviously smaller than that in the other portions of the pixel region. In the resultant product, there exists a cloudy Mura (as shown in FIG. 2A) at the edge of the pixel region adjacent to the driving circuit pattern. Such cloudy Mura may have an influence on the subsequent etching procedure, causing increased difficulty for the etching process, making it difficult to control the parameters of the etching process, giving rise to occurrence of etching Mura, and decreasing the yield of products.

SUMMARY

According to one aspect of the disclosed technology, an array substrate is provided. The array substrate comprises a base substrate comprising a pixel region and a driving circuit region; wherein the driving circuit region formed on the base substrate comprises a common electrode driving interface pattern, and a gate driving interface pattern and a data line driving interface pattern, which are connected with the common electrode driving interface pattern, and wherein the common electrode driving interface pattern comprises slits therein and the portions of the common electrode driving interface pattern divided by the slits are connected with one another.

According to another aspect of the disclosed technology, a liquid crystal display is provided. The liquid crystal display comprises an outer frame, a liquid crystal panel and a driving circuit. The liquid crystal panel comprises a color filter substrate, an array substrate as described above and a liquid crystal layer filled between the color filter substrate and the array substrate.

According to another aspect of the disclosed technology, there is provided a method of manufacturing an array substrate. The method comprises following steps in order: sequentially depositing a transparent common electrode thin film and a gate metal thin film on a base substrate and then forming patterns comprising a transparent common electrode, a gate line, a gate electrode, a common electrode driving interface pattern and a gate line driving interface pattern through a first photolithography process, wherein slits are formed in the common electrode driving interface pattern, and the portions of the common electrode driving interface pattern divided by the slits are connected with one another; sequentially depositing a gate insulation layer thin film, an active layer thin film and a source and drain metal thin film on the base substrate and then forming patterns comprising a gate insulation layer, an active layer, a data line, a data line driving interface pattern, a source electrode and a drain electrode through a second photolithography process; depositing a passivation thin film on the base substrate and then forming patterns comprising a passivation layer and a passivation layer via hole through a third photolithography process; and depositing a pixel electrode thin film on the base substrate and then forming patterns comprising a pixel electrode through a fourth photolithography process, wherein the pixel electrode is connected with the drain electrode by the passivation layer via hole.

Further scope of applicability of the disclosed technology will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF DRAWINGS

The disclosed technology will become more fully understood from the detailed description given hereinafter and the accompanying drawings which are given by way of illustration only, and thus are not limitative of the disclosed technology and wherein.

DETAILED DESCRIPTION

Embodiments of the disclosed technology will be described clearly and completely in combination with the figures of the embodiments of the disclosed technology, so as to make objects, technical solutions and advantages of the embodiments of the disclosed technology to be clearer. Obviously, the described embodiments are portion of the embodiments of the disclosed technology, not all the embodiments. Based on the embodiments of the disclosed technology, the other embodiments obtained by those skilled in the art without giving inventive work belong to the scope of the disclosed technology.

First Embodiment

Figure 3A:
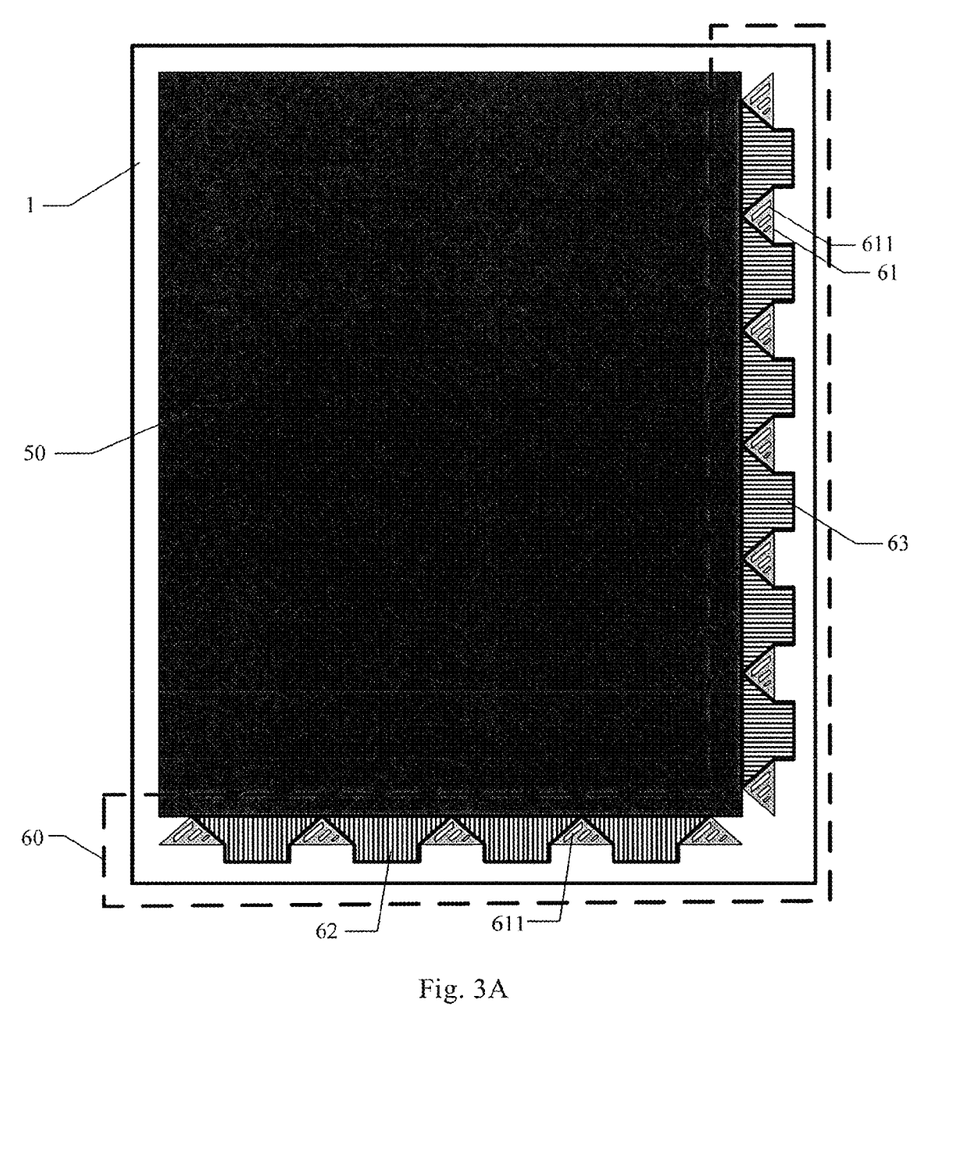
FIG. 3A is a top structural view of the array substrate provided by a embodiment of the disclosed technology.
Figure 3B:
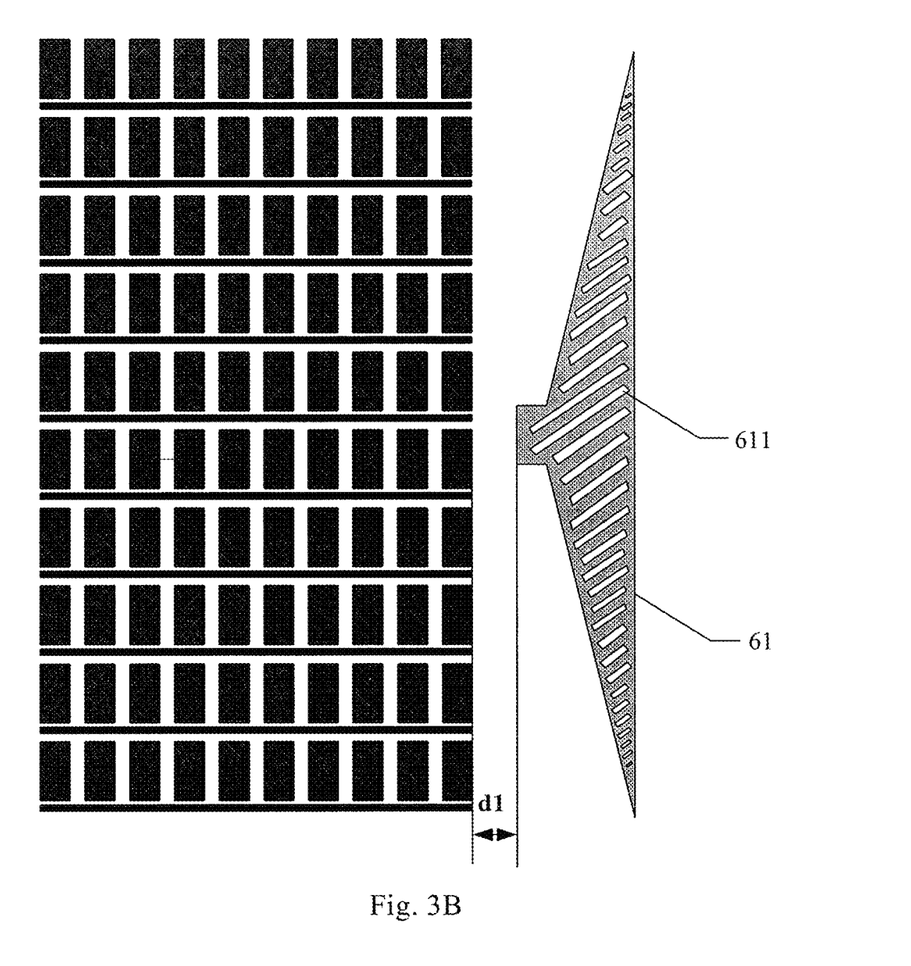
FIG. 3B is an enlarged view of the common electrode driving interface pattern in FIG. 3A.
Figure 3C:
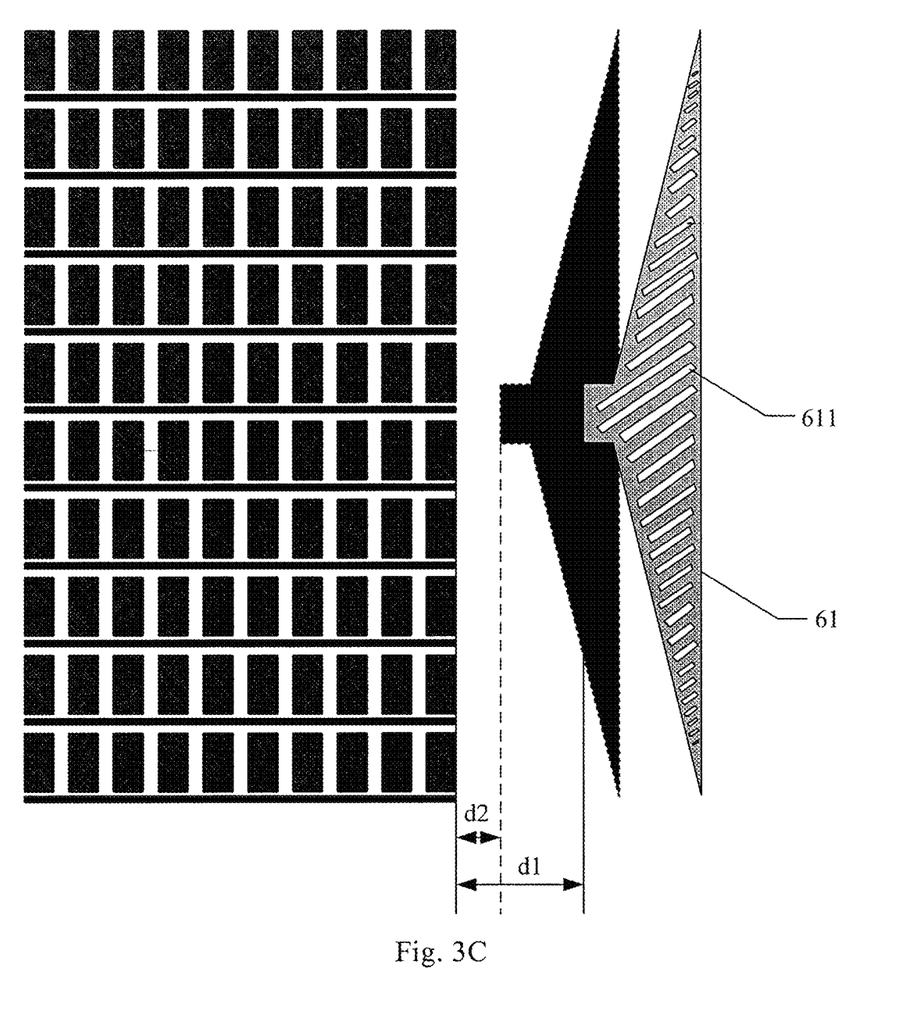
FIG. 3C is a view of a positional relationship of the driving circuit region and the pixel region in FIG. 3A.

FIG. 3A is a top structural view of an array substrate provided by an embodiment of the disclosed technology, FIG. 3B is an enlarged view of the common electrode driving interface pattern in FIG. 3A, and FIG. 3C is a view of the positional relationship of the driving circuit region and the pixel region in FIG. 3A. As shown in FIG. 3A, the array substrate of the present embodiment comprises a base substrate 1, and a pixel region 50 and a driving circuit region 60 are formed on the base substrate 1.

A transparent common electrode and data lines and gate lines transversely and longitudinally crossed with each other are formed on the base substrate in the pixel region 50. The data lines and the gate lines define the pixel units arranged in a matrix form, and each pixel unit comprises a thin film transistor (TFT) switch and a pixel electrode. Each TFT switch comprises a gate electrode, a source electrode, a drain electrode, and an active layer formed between the gate electrode and the source and drain electrodes. The gate electrode is connected with a gate line, the source electrode is connected with a data line, and the drain electrode is connected with the pixel electrode of the corresponding pixel region. The gate line and the gate electrode are provided above the transparent common electrode, and are integrally formed on the base substrate 1, the gate line is covered by a gate insulation layer; an active layer is formed on the gate insulation layer, and then the source and drain electrodes, the active layer and other elements of the TFT are fainted on the gate insulation layer.

A common electrode driving interface pattern 61, a gate line driving interface pattern 62 and a data line driving interface pattern 63 are formed on the base substrate 1 in the driving circuit region 60. The gate line driving interface pattern 62 and the data line driving interface pattern 63 are connected with the common electrode driving interface pattern 61, respectively. The gate line driving interface pattern 62 is connected with an external driving circuit and supplies the gate voltages to the gate lines, and at the same time supplies a common electrode voltage to the common electrode driving interface pattern 61, which is connected with the gate line driving interface pattern 62. The data line driving interface pattern 63 is connected with an external driving circuit and supplies data signal to the data line, and at the same time supplies a common electrode voltage to the common electrode driving interface pattern 61, which is connected with the data line driving interface pattern 63. As shown in FIG. 3B, in the present embodiment, slits 611 are formed in the common electrode driving interface pattern 61. Further, the respective portions of the common electrode driving interface pattern 61 divided by the slits 611 are connected with one another.

Figure 2B:
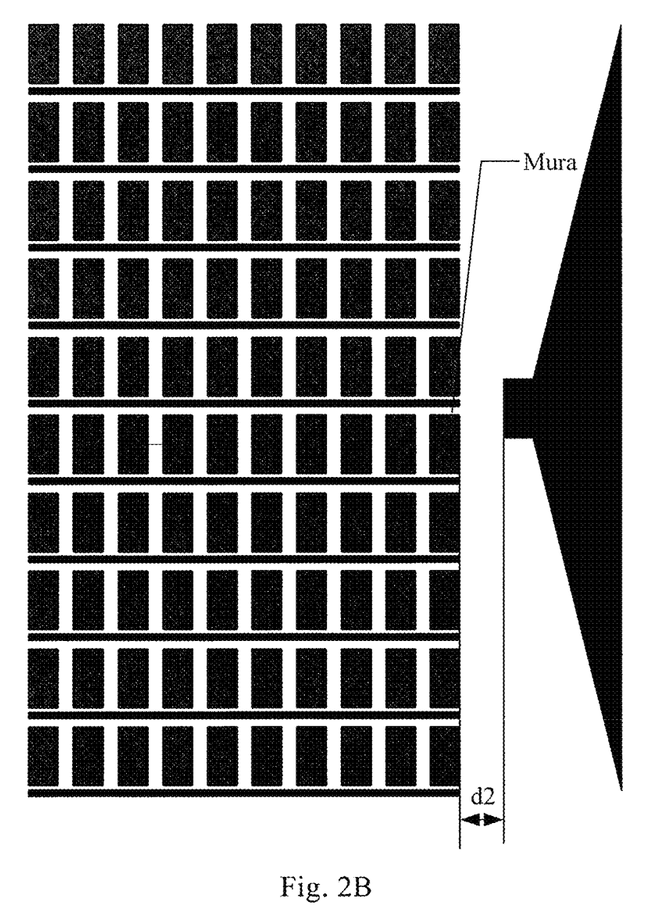
FIG. 2B is an enlarged view of the common electrode driving interface pattern in FIG. 2A.

In the conventional technology, the common electrode driving interface pattern is formed along with the pattern of the transparent common electrode, the gate lines, and the gate electrodes, and the detailed structure can be found in FIGS. 2A and 2B. In the exposure process in the manufacturing procedure of the conventional array substrate, the common electrode driving interface pattern 61 correspond to the unexposed region of the mask plate; thus in the developing process, the photoresist (e.g., positive photoresist) coated for forming the common electrode driving interface pattern 61 will be remained completely, that is, substantially does not consume the developing solution; the common electrode driving interface pattern 61 shown in FIG. 2B is further formed through a subsequent etching process. From the above analysis, as to the conventional technology, during forming the common electrode driving interface pattern 61, since the developing solution is not substantially consumed, the concentration of developing solution in the area for the common electrode driving interface pattern is higher than that in the surrounding and adjacent pixel regions, so the developing solution will flow or diffuse from the high concentration region to the low concentration region, making the concentrations of the developing solution not uniform over the entire pixel region. That is, the concentrations of the developing solution in the portion of the pixel region adjacent to the driving circuit region is relatively higher, and more photoresist will be removed in developing in this region, i.e., more film may be etched away. As a result, cloudy Mura as shown in FIG. 2A appears.

Compared with FIG. 2B, the slits 611 are formed on the common electrode driving interface pattern 61 in the present embodiment; during forming the common electrode driving interface pattern 61 comprising the slits 611, the portion of the mask plate for exposure corresponding to the common electrode driving interface pattern 61 comprises slits corresponding to the slits 611, that is, the position of the common electrode thin film corresponding to the silts of the common electrode driving interface pattern 61 will be subject to partial exposure and development and then etched; in this way, in the developing process, the developing solution corresponding to the common electrode driving interface pattern 61 can be partly consumed, and therefore the concentration of developing solution in this region is decreased, reducing and eliminating the difference of the concentration of developing solution in the driving circuit region and the portion of the pixel region adjacent thereto, which ensures the uniformity of the concentration of developing solution throughout the pixel region. The cloudy Mura phenomenon can be alleviated or eliminated, and the yield and quality of the final array substrate can be improved.

Further, in the above technical solution, the slits 611 may be uniformly distributed in the common electrode driving interface pattern 61. Such structure may be achieved by using a mask plate which has uniformly distributed slits at the position corresponding to those in the common electrode driving interface pattern 61. Such structure can make the developing solution in the region corresponding to the common electrode driving interface pattern 61 to be uniformly consumed, and make the formed common electrode driving interface pattern 61 be of better quality.

Further, in the above technical solution, the shape of each slit 611 may be a quadrangle, and for example may be a rectangular, a parallelogram or an irregular quadrangle, as shown in FIG. 3B, but the disclosed technology is not limited thereto. For example, the slits 611 may also be a structure having a round shape, an elliptical shape or other polygonal shape which is uniformly distributed in the common electrode driving interface pattern 61. Moreover, those skilled in the art can choose a desired shape in combination with the actual manufacturing process, and guarantee that the slit shape on the used mask plate is consistent with the desired shape.

In addition, as shown in FIG. 3C, in the array substrate of the present embodiment, a distance "d1" between the driving circuit region (for illustration purpose, the driving circuit region is represented with the common electrode driving interface pattern in FIG. 3C, and its position is shown by the solid line) and the pixel region is equal to or greater than 3 mm. In the conventional technology, a distance "d2" between the driving circuit region and the pixel region is generally between 1 and 1.5 mm, and the position of the driving circuit region may be referred to the dotted line in FIG. 3C. Compared with the conventional technology, the present embodiment increases the distance between the driving circuit region and the pixel region to further reduce the influence of the driving circuit region on the concentration of developing solution in the adjacent portions of the pixel region, allowing the thickness of the photoresist of the exposed portion in the pixel region to maintain better uniformity and preventing the cloudy Mura from appearing in the pixel region.

Figure 3D:
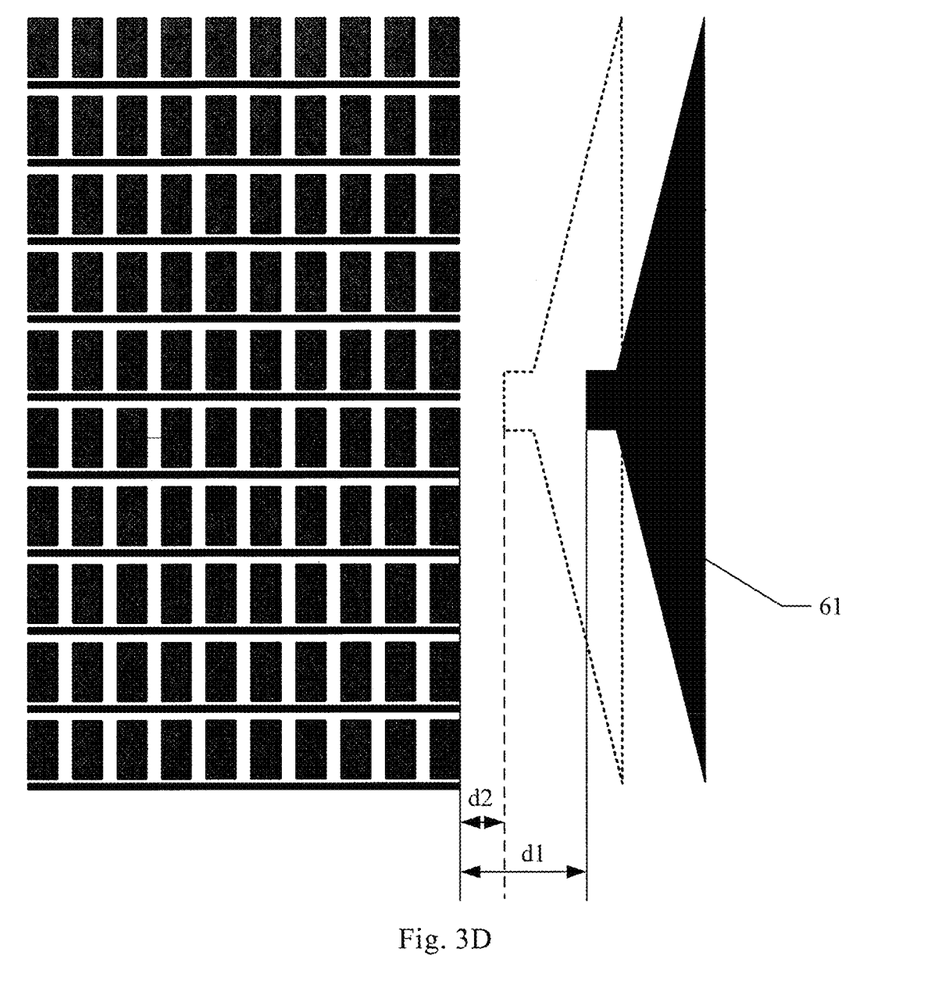
FIG. 3D is a view of another positional relationship of the driving circuit region and the pixel region in FIG. 3A.

It needs to be explained here that, the technical solution of increasing the distance between the driving circuit region and the pixel region in the present embodiment is based on the technical solution of the common electrode driving interface pattern formed with slits provided by the above embodiment of the disclosed technology. However, the technical solution of increasing the distance between the driving circuit region and the pixel region in the present embodiment may be embodied independently, as shown in FIG. 3D. In FIG. 3D, the common electrode driving interface pattern 61 is a common electrode driving interface pattern as that in the conventional technology, that is, without slits, and the distance d1 between the driving circuit region and the pixel region (In the drawing, the solid line is the position of the driving circuit region according to the embodiment of the disclosed technology) is equal to or greater than 3 mm, which is greater than the distance d2 in the conventional technology (in the drawing, the dotted line is the position of the driving circuit region in the conventional technology). That is, the structure as shown in FIG. 3D may also reduce the influence of the driving circuit region on the concentration of developing solution of the adjacent pixel region, guarantee the uniformity of the concentration of developing solution throughout the pixel region, maintain the uniformity of the thickness of the photoresist in the pixel region after exposure and development, avoid or prevent the appearance of the cloudy Mura in the pixel region, and further improve the yield and quality of the array substrate.

The manufacturing process of the array substrate of the present embodiment is provided in the second embodiment.

Second Embodiment

According to the present embodiment, a manufacturing method of the array substrate comprises the following steps.

Step 401: sequentially depositing a transparent common electrode thin film and a gate metal thin film on a base substrate, and forming a pattern comprising a transparent common electrode, a gate line, a gate electrode, a common electrode driving interface pattern and a gate line driving interface pattern through a photolithography process (patterning process), wherein slits are formed in the common electrode driving interface pattern, and the respective portions of the common electrode driving interface pattern divided by the slits are connected with one another;

Step 402: sequentially depositing a gate insulation layer thin film, an active layer thin film and a source and drain metal thin film on the base substrate formed with the above pattern, and forming a pattern comprising a gate insulation layer, an active layer, a data line, a data line driving interface pattern, a source electrode and a drain electrode through a photolithography process;

Step 403: depositing a passivation thin film on the base substrate formed with the above patterns, and forming pattern comprising a passivation layer and a passivation layer via through photolithography process;

Step 404: depositing a pixel electrode thin film on the base substrate formed with the above patterns, and forming a pattern comprising a pixel electrode through a photolithography process, wherein the pixel electrode is connected with the drain electrode by the passivation layer via.

The patterning process in the present embodiment generally comprises coating photoresist, exposing and developing, etching and removing photoresist, and so on; and a positive type photoresist is used for example, an exposed portion will be removed in development, and an unexposed portion will be retained in development. A detailed description is made to the patterning process of the present embodiment by taking the step 401 as an example. An example of the step 401 comprises the following sub-steps.

Step 4011: sequentially depositing a transparent common electrode thin film and a gate metal thin film on the base substrate, wherein the transparent common electrode thin film for example is indium tin oxide (ITO), indium zinc oxide (IZO) or the like;

Step 4012: coating a layer of photoresist on the above thin film;

Step 4013: performing exposure on the photoresist by using a gray tone or half tone mask plate, and sequentially performing developing, to form a photoresist pattern comprising a completely exposed region, a partially exposed region and an unexposed region. In the common electrode driving interface pattern of the present embodiment, slits are provided in the mask plate for exposure adopted by the present embodiment at the positions corresponding to the slits in the common electrode driving interface pattern, that is, the slits on the common electrode driving interface pattern correspond to the completely exposed region.

Step 4014: performing a first etching to remove the gate metal thin film and the transparent metal thin film in the completely exposed region to form a pattern comprising the gate line, the gate electrode, the common electrode driving interface pattern and the gate line driving interface pattern;

Step 4015: performing ashing treatment according to the thickness of the photoresist of the partially exposed region (corresponding to the pixel region) to remove the photoresist in the partially exposed region and partially remove the photoresist in the complete opaque region;

Step 4016: performing a second etching to remove the gate metal thin film in the partially exposed region to form a pattern comprising the transparent common electrode;

Step 4017: removing the remaining photoresist in the unexposed region.

So far, the first patterning process is accomplished, i.e., the step 401 ends here. The patterns comprising the transparent common electrode, the gate line, the gate electrode, the common electrode driving interface pattern and the gate line driving interface pattern are formed by the above steps.

Since the other steps are similar to the step 401, the detailed description to them is omitted for simplicity. According to the manufacturing method of the array substrate provided by the present embodiment, a common electrode driving interface pattern having slits can be obtained. The consumption of developing solution in manufacturing such structure reduces the influence of the driving circuit region on the concentration of developing solution in the pixel region, improves the uniformity of the concentration of developing solution in the pixel region, allows the photoresist after being exposed and developed in the pixel region to have an excellent uniformity, avoid or prevent the appearance of the cloudy Mura in the pixel region, and finally improves the yield and quality of the resultant array substrate.

Further, it should be noted that the manufacturing method of the array substrate of the present embodiment can produce an array substrate on which slits are uniformly distributed in the common electrode driving interface pattern by using a half tone or gray tone mask plate in the patterning process. In this way, it can be guaranteed that the common electrode driving interface pattern has good quality.

Moreover, the slits in the common electrode driving interface pattern of the array substrate may be implemented in a shape of rectangular, round shape, elliptical shape or polygonal shape or the like.

In the technical solution of the embodiment, the common electrode driving interface pattern, the gate line driving interface pattern and the data line driving interface pattern constitute the driving circuit region; the gate line, the data line, the active layer surrounded by the gate line and the data line, the gate electrode, the source electrode, the drain electrode, the passivation layer, and the passivation layer via hole form the pixel unit of the pixel region. In addition, in the array substrate obtained through the method of the present embodiment, the distance between the driving circuit region and the pixel region is equal to or greater than 3 mm. Compared with the conventional technology, the increased distance between the driving circuit region and the pixel region can further reduce the influence of the driving circuit region on the concentration of developing solution in the pixel region, guarantee the uniformity of the concentration of developing solution in the pixel region, maintain an uniformity of the thickness of the photoresist after being exposed and developed in the pixel region, avoid or prevent the appearance of the cloudy Mura in the pixel region, and further improve the yield and quality of the resultant array substrate.

Third Embodiment

The present embodiment provides a liquid crystal display, which comprises an outer frame, a liquid crystal panel and a driving circuit and so on. The liquid crystal display comprises a color filter substrate, an array substrate and a liquid crystal layer filled between the color filter substrate and the array substrate. The array substrate is according to any embodiment of the disclosed technology, and may be produced by using the manufacturing method according to the embodiment of the disclosed technology, thus the detailed description is omitted here. In addition, the outer frame is used to fix and protect the liquid crystal panel. The liquid crystal panel is connected with the driving circuit after the liquid crystal panel is accommodated in the frame to obtain the liquid crystal display of the present embodiment.

Since the liquid crystal display of the present embodiment has the array substrate provided by the disclosed technology, it reduces or prevents the appearance of the cloudy Mura in the pixel region and has better display quality.

It should be explained finally that the above embodiments are only used to explain the technical solution of the disclosed technology, and it is not intended to limit the technical solution of the disclosed technology. Although the disclosed technology is described in detail with reference to the forgoing embodiments, those skilled in the art should understand: they still may make modifications to the technical solution described by the forgoing embodiments, or make equivalent substitution to some of the technical features. All such modifications or substitutions will not make the nature of the corresponding technical solution depart from the spirit and scope of the technical solution of various embodiments of the disclosed technology.

What is claimed is:

1. An array substrate, comprising:
a base substrate comprising a pixel region and a driving circuit region;
wherein the pixel region is a display region and the driving circuit region is provided outside the pixel region,
wherein the driving circuit region formed on the base substrate comprises a common electrode driving interface pattern, and a gate driving interface pattern and a data line driving interface pattern, which are directly connected with the common electrode driving interface pattern, and
wherein the common electrode driving interface pattern provided in the driving circuit region comprises slits therein and portions of the common electrode driving interface pattern divided by the slits are connected with one another, and the common electrode driving interface pattern in the driving circuit region and a transparent common electrode in the pixel region are provided in a same layer.

2. The array substrate according to claim 1, wherein the slits are uniformly distributed in the common electrode driving interface pattern.

3. The array substrate according to claim 1, wherein a shape of the slits is selected from the group consisting of a rectangular shape, a round shape, an elliptical shape, and a polygonal shape.

4. The array substrate according to claim 1, wherein a distance between the driving circuit region and the pixel region is equal to or greater than 3 mm.

5. A liquid crystal display, comprising:
an outer frame,
a liquid crystal panel, and
a driving circuit,
wherein the liquid crystal panel comprises a color filter substrate, an array substrate according to claim 1, and a liquid crystal layer filled between the color filter substrate and the array substrate.

6. The array substrate according to claim 1, wherein the common electrode driving interface pattern and the transparent common electrode are the same material.

7. The array substrate according to claim 1, wherein the common electrode driving interface pattern and the transparent common electrode are each one of ITO and IZO.

* * * * *